United States Patent
Lee et al.

(10) Patent No.: US 11,967,559 B2
(45) Date of Patent: Apr. 23, 2024

(54) ELECTRONIC PACKAGE

(71) Applicant: Advanced Semiconductor Engineering, Inc., Kaohsiung (TW)

(72) Inventors: Chang Chi Lee, Kaohsiung (TW); Chiu-Wen Lee, Kaohsiung (TW); Jung Jui Kang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 233 days.

(21) Appl. No.: 17/535,400

(22) Filed: Nov. 24, 2021

(65) Prior Publication Data

US 2023/0163077 A1     May 25, 2023

(51) Int. Cl.
*H01L 23/538* (2006.01)
*H01L 25/065* (2023.01)

(52) U.S. Cl.
CPC ...... *H01L 23/5384* (2013.01); *H01L 23/5386* (2013.01); *H01L 25/0655* (2013.01)

(58) Field of Classification Search
CPC ............ H01L 23/5384; H01L 23/5386; H01L 25/0655; H01L 23/49816; H01L 23/5383; H01L 24/48; H01L 23/5389; H01L 23/50; H01L 23/5385; H01L 24/24; H01L 25/0652; H01L 25/16
See application file for complete search history.

(56) References Cited

U.S. PATENT DOCUMENTS

| | | | |
|---|---|---|---|
| 10,748,870 B2 | 8/2020 | Yu et al. | |
| 2020/0105653 A1* | 4/2020 | Elsherbini | H01L 24/02 |
| 2020/0194393 A1 | 6/2020 | Wu et al. | |
| 2020/0402934 A1 | 12/2020 | Kim et al. | |
| 2022/0415805 A1* | 12/2022 | Waidhas | H01L 23/3675 |

* cited by examiner

*Primary Examiner* — Elias Ullah
(74) *Attorney, Agent, or Firm* — FOLEY & LARDNER

(57) ABSTRACT

An electronic package is provided. The electronic package includes a semiconductor substrate. The semiconductor substrate includes a first active region and a first passive region separated from the first active region. The first active region is configured to regulate a power signal. The first passive region is configured to transmit a data signal.

7 Claims, 11 Drawing Sheets

ELECTRONIC PACKAGE

BACKGROUND

1. Technical Field

The present disclosure relates generally to an electronic package.

2. Description of the Related Art

With developments in smart mobile devices, the demand to integrate multiple components (e.g., multiple Integrated Circuits (ICs)) into a single device package to achieve multiple desired functions has significantly increased. However, integrating multiple components in a single device package while still achieving desired functions brings various challenges. For example, transmitted signals by one or more components in a device package may be distorted due to relatively long electrical paths in the device package, as more components are included in the device package. In addition, a relatively large carrier may be required to support and electrically connect multiple functional chiplets disposed thereon, decreasing the yield.

SUMMARY

In some arrangements, an electronic package includes a semiconductor substrate. The semiconductor substrate includes a first active region and a first passive region separated from the first active region. The first active region is configured to regulate a power signal. The first passive region is configured to transmit a data signal.

In some arrangements, an electronic package includes a first semiconductor substrate, a second semiconductor substrate, and an external connection element. The first semiconductor substrate includes a first active region and a first passive region. The second semiconductor substrate is physically separated from the first semiconductor substrate. The external connection element electrically connects the first semiconductor substrate and the second semiconductor substrate.

In some arrangements, an electronic package includes a semiconductor substrate. The semiconductor substrate includes a first element and a second element. The first element is configured to convert a first power signal to a second power signal and supply the second power signal to a first electronic component. The second element is spaced apart from the first element and configured to transmit a first data signal to the first electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
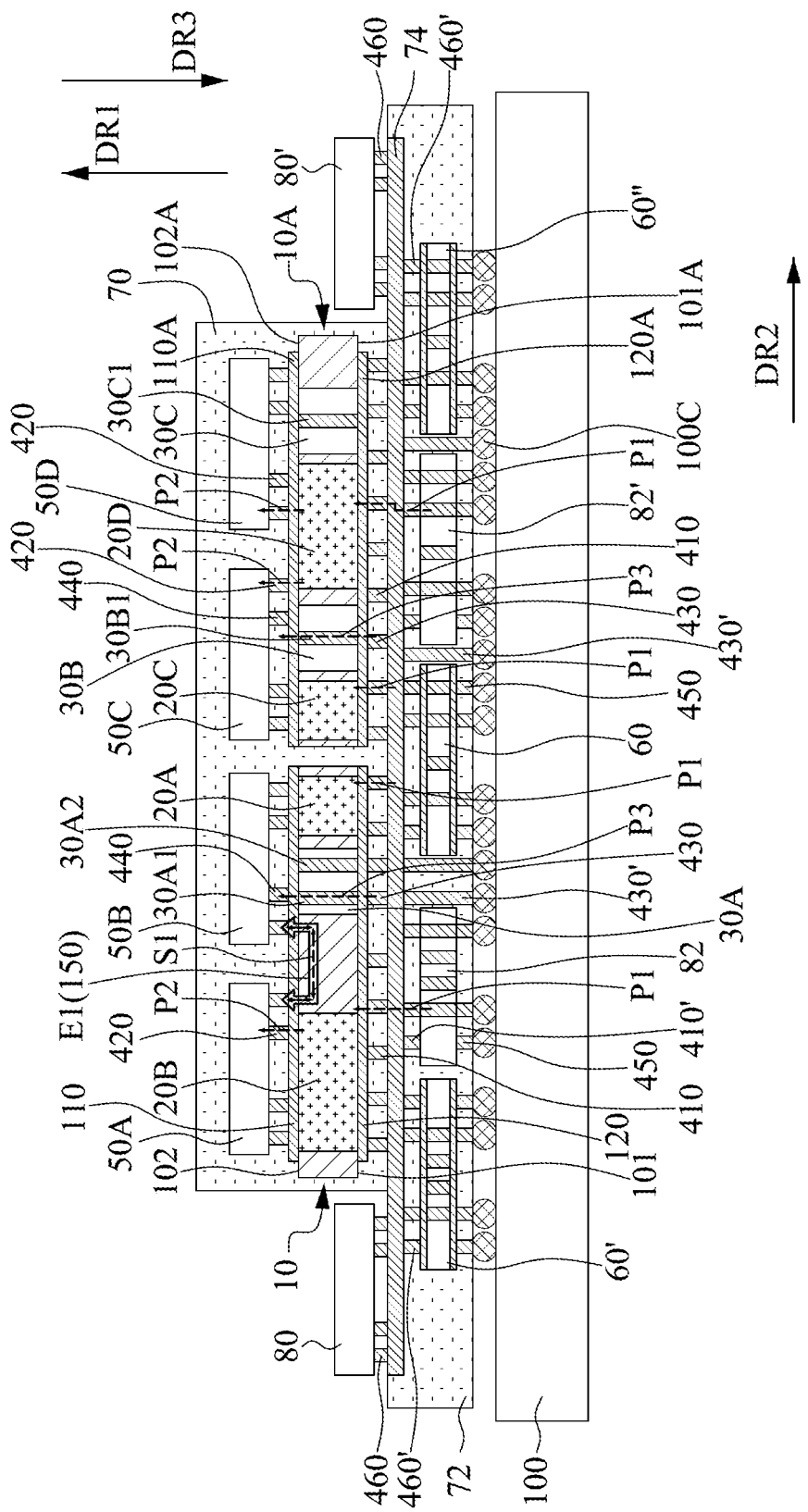
FIG. 1 is a cross-section of an electronic package in accordance with some arrangements of the present disclosure.

FIG. 1 is a cross-section of an electronic package 1 in accordance with some arrangements of the present disclosure. The electronic package 1 includes a carrier 100, semiconductor substrates 10 and 10A, electronic components 50A, 50B, 50C, 50D, 80, 80', 82, and 82', external connection elements 60, 60', and 60'', and encapsulants 70 and 72.

The carrier 100 may be or include a substrate. Examples of the substrate include one or more of a paper-based copper foil laminate, a composite copper foil laminate, a polymer-impregnated glass-fiber-based copper foil laminate, or so on. The carrier 100 may be or include an interconnection structure including, for example, one or more conductive traces and/or one or more through vias. In some arrangements, the carrier 100 may be or include at least one of a ceramic material, an organic substrate, or a metal plate. In some arrangements, the carrier 100 may be or include a printed circuit board (PCB).

The semiconductor substrate 10 is disposed over the carrier 100. The semiconductor substrate 10 may be electrically connected to the carrier 100 through conductive elements 100C. The conductive elements 100C may be or include one or more of conductive bumps, solder balls, conductive pillars, or so on. In some arrangements, the semiconductor substrate 10 may be or include a silicon-based substrate. In some arrangements, the semiconductor substrate 10 may be or include a silicon-based substrate having through silicon vias (TSVs). The semiconductor substrate 10 may include a surface 101 and a surface 102 opposite to the surface 101. In some arrangements, the semiconductor substrate 10 includes a conductive layer 110 disposed on the surface 102 and/or exposed by the surface 102. In some arrangements, the semiconductor substrate 10 includes a conductive layer 120 disposed under the surface 102 and/or exposed by the surface 101. The conductive layers 110 and 120 may each be or include a redistribution layer (RDL). The conductive layers 110 and 120 may be referred to as back-end-of-lines (BEOLs).

In some arrangements, the semiconductor substrate 10 includes one or more active regions (e.g., active regions 20A and 20B) configured to regulate a power signal (e.g., power signal P1) into another power signal (e.g., power signal P2). In some arrangements, the power signal P1 and the power signal P2 are different in at least one of amplitude, frequency, and waveform. In some arrangements, the power signal P1 may be a power supplied or transmitted directly from a power source or a power management component, such as a power management integrated circuit (PMIC). The regulated power signal P2 may be transmitted to one or more of the electronic components 50A-50D. The power signal P2 may be a driving signal configured to drive one of the electronic components 50A-50D. In some arrangements, the active region (e.g., the active region 20A) is configured to covert the power signal P1 to the power signal P2 and supply the power signal P2 to one of the electronic components 50A-50D. In some arrangements, another active region (e.g., the active region 20B) may be configured to covert another power signal P1 to another power signal P2 and supply the power signal P2 to one of the electronic components 50A-50D. The regulated power signal P2 transmitted to the electronic component 50A may be different from the regulated power signal P2 transmitted to the electronic component 50B depending on different functions and/or designs of the electronic components 50A and 50B. The regulated power signal P2 transmitted to different electronic components may be different in at least one of amplitude, frequency, and waveform. In other arrangements, the power signal P1 and the power signal P2 each include a DC voltage, a DC current, or ground. In some arrangements, one active region may regulate the power signal P1 into two or more different power signals P2 that are respectively transmitted to different electronic components. In some arrangements, the active region (e.g., the active regions 20A and 20B) includes a plurality of conductive through vias (e.g., TSVs). In some arrangements, the active region (e.g., the active regions 20A and 20B) includes a passive element structure, for example, one or more capacitors, inductors, resistors, or a combination thereof. In some arrangements, the semiconductor substrate 10 including one or more active regions and TSVs may be referred to as an active interposer. In some arrangements, the conductive through vias of the active region may be electrically connected to one or more active components and/or one or more passive components. In some arrangements, the semiconductor substrate 10 includes an active connection element.

In some arrangements, the semiconductor substrate 10 further includes a passive region 30A separated from the active regions 20A and 20B by the silicon-based material of the semiconductor substrate 10. In some arrangements, the passive region 30A is configured to transmit a data signal P3 different from the regulated power signal P2. In some arrangements, the power signal P2 and the data signal P3 are AC signals that are different in at least one of amplitude, frequency, and waveform. In some arrangements, the data signal P3 includes a DC voltage or a DC current. In some arrangements, the passive region 30A is configured to transmit the data signal P3 to one of the electronic components 50A-50D. In some arrangements, the passive region 30A is spaced apart from the active regions 20A and 20B and configured to transmit the data signal P3 to one (e.g., 50B) of the electronic components 50A-50D. The passive region 30A may be spaced apart from the active regions 20A and 20B by the silicon-based material of the semiconductor substrate 10. The data signal P3 may be an electrical signal transmitted between an element (e.g., the carrier 100 or one or more of the electronic components 80, 80', 82, and 82') and one (e.g., 50B) of the electronic components 50A-50D. In some arrangements, the passive region 30A is between the active region 20B and the active region 20A. In some arrangements, the passive region 30A includes one or more conductive through vias (e.g., conductive through vias 30A1 and 30A2). In some arrangements, the conductive through vias 30A1 and 30A2 are disposed between the active region 20B and the active region 20A. In some arrangements, the conductive through vias of the passive region 30A are configured to transmit the data signal P3.

The semiconductor substrate 10 may include various structures or elements configured to perform various functions. In some arrangements, the semiconductor substrate 10 may include an active element configured to convert the power signal P1 to the power signal P2 different from the power signal P1. In some arrangements, the active region (e.g., the active regions 20A and 20B) of the semiconductor substrate 10 includes at least one active element. In some arrangements, the active element includes an integrated voltage regulator (IVR) component. The IVR component may include an IVR circuit and at least one passive element such as one or more capacitors, inductors, resistors, or a combination thereof. The passive element structure may be electrically coupled to the IVR circuit. In some arrangements, the semiconductor substrate 10 including the active element (e.g., an IVR component) embedded in the silicon-based substrate may be referred to as an active interposer. In some arrangements, the power signal P1 is received from a terminal (e.g., one of terminals 410) on or adjacent to the surface 101, and the regulated power signal P2 is transmitted to a terminal (e.g., one of terminals 420) on or adjacent to the surface 102. In some arrangements, the semiconductor substrate 10 may further include a network-on-chip (NOC), a static random access memory (SRAM), and/or a PMIC embedded in the silicon-based substrate. In some arrangements, the active region of the semiconductor substrate 10 includes the NOC, the SRAM, and/or the PMIC. In some embodiments, the amplitude or the waveform of the power signal P1 may be regulated to the power signal P2 by an IVR component and optionally a PMIC component in the active region depending on the actual applications. For example, when the power signal P1 has a relatively high voltage and may pass a relatively long transmission path, the power signal P1 may be regulated by a PMIC component followed by an IVR component to the power signal P2 which is then transmitted to an electronic component, and the IVR component is closer to the electronic component than the PMIC component is. For example, when the power signal P1 has a relatively low voltage and may pass a relatively short transmission path, the power signal P1 may be regulated by an IVR component to the power signal P2.

In some arrangements, the semiconductor substrate 10 may further include another element (or a passive element) spaced apart from the active element and configured to transmit the data signal P3 which is different from the regulated power signal P2. In some arrangements, the data signal P3 is transmitted from a terminal (e.g., one of terminals 430) on or adjacent to the surface 101 to a terminal (e.g., one of terminals 440) on or adjacent to the surface 102. In some arrangements, the passive element includes one or more conductive through vias (e.g., conductive through vias 30A1 and 30A2) spaced apart from one another. In some arrangements, the conductive through vias 30A1 and 30A2 are configured to transmit different signals. For example, the through via 30A1 may be configured to transmit a signal between the electronic component 50B and the carrier 100, and the through via 30A2 may be configured to connect to ground through the carrier 100. In some arrangements, the power signal P2 and the data signal P3 are transmitted along or parallel to a direction DR1. The direction DR1 may be substantially perpendicular to the surface 101 and/or 102 of the semiconductor substrate 10. In some arrangements, the conductive through vias 30A1 and 30A2 are disposed between the active element(s) (e.g., the active element(s) in the active region 20B) and the semiconductor substrate 10A. In some arrangements, the passive region 30A is different from the active region 20A or 20B in that the conductive through vias of the active region 20A or 20B may be electrically connected to one or more active components and/or one or more passive components, while the conductive through vias of the passive region 30A transmit the data signal P3 along or parallel to the direction DR1.

In some arrangements, the semiconductor substrate 10 may further include an additional element 150 configured to transmit a signal S1 along or parallel to a direction DR2 different from the direction DR1. The direction DR2 may be substantially perpendicular to the direction DR1. The direction DR2 may be substantially parallel to the surface 101 and/or 102 of the semiconductor substrate 10. The signal S1 may be an electrical signal transmitted between two (e.g., 50A and 50B) of the electronic components 50A-50D. In some arrangements, the signal S1 may be or include high speed data transmitted between two of the electronic components 50A-50D. In some arrangements, the signal S1 includes an AC signal or digital signal. In some arrangements, the additional element 150 is further configured to transmit the signal S1 in the direction D1 and/or in a direction DR3 substantially parallel to the direction DR1. For example, the signal S1 may be transmitted through the additional element along a conductive path E1 which includes the direction DR1, the direction DR2, and then the direction DR3 between the electronic components 50A and 50B. In some arrangements, the additional element configured to transmit the signal S1 includes an interconnection structure in at least one of the active region 20B and portions of the conductive layer 110 (or the RDL). It should be noted that the conductive path E1 in FIG. 1 is shown for only exemplary purposes, and the signal S1 may be transmitted through various conductive paths between two of the electronic components 50A-50D by the element along the directions DR1, DR2, and DR3.

The semiconductor substrate 10A is disposed over the carrier 100. The semiconductor substrate 10A may be electrically connected to the carrier 100 through the conductive elements 100C. In some arrangements, the semiconductor substrate 10A may be or include a silicon-based substrate. In some arrangements, the semiconductor substrate 10A may be or include a silicon-based substrate having TSVs. In some arrangements, the semiconductor substrate 10A includes a semiconductor chip. The semiconductor substrate 10A may include a surface 101A and a surface 102A opposite to the surface 101A. In some arrangements, the semiconductor substrate 10A includes a conductive layer 110A disposed on the surface 102A and/or exposed by the surface 102A and a conductive layer 120A disposed under the surface 101A and/or exposed by the surface 101A. The conductive layers 110A and 120A may each be or include an RDL. The conductive layers 110A and 120A may be referred to as BEOLs. In some arrangements, the semiconductor substrate 10A may include a structure similar to that of the semiconductor substrate 10. It should be noted that while the electronic package 1 includes two semiconductor substrates 10 and 10A in accordance with some arrangements illustrated in FIG. 1, the number of the semiconductor substrates such as but not limited to the semiconductor substrates 10 and 10A may vary according to actual application.

In some arrangements, the semiconductor substrate 10A includes one or more active regions (e.g., active regions 20C and 20D) configured to regulate a power signal P1 into a power signal P2 different from the power signal P1. In some arrangements, one active region may regulate the power signal P1 into two or more different power signals P2 that are respectively transmitted to different electronic components. For example, the active region 20D regulates the power signal P1 into two different power signals P2 that respectively transmitted to the electronic components 50C and 50D. In some arrangements, each active region (e.g., the active regions 20C and 20D) of the semiconductor substrate 10A is physically separated from the semiconductor substrate 10. For example, the active regions 20C and 20D are physically separated from the active regions 20A and 20B. Similar to the semiconductor substrate 10, the active region of the semiconductor substrate 10A may include a plurality of conductive through vias and at least one passive element. In some arrangements, the semiconductor substrate 10A including one or more active regions 20C and 20D and TSVs may be referred to as an active interposer. In some arrangements, the semiconductor substrate 10A includes an active connection element.

In some arrangements, the semiconductor substrate 10A further includes one or more passive regions (e.g., passive regions 30B and 30C) separated from the active regions (e.g., the active regions 20C and 20D) by the silicon-based material of the semiconductor substrate 10A. In some arrangements, the passive regions 30B and 30C are configured to transmit a data signal P3 which is different from the regulated power signal P2. In some arrangements, the passive region 30B is between the active region 20C and the active region 20D. In some arrangements, the passive region 30B is between the active region 20A and the active region 20D. In some arrangements, the passive region 30A is between the active region 20B and the active region 20C. In some arrangements, the passive region of the semiconductor substrate 10A is physically spaced apart from the active region of the semiconductor substrate 10. In some arrangements, the passive regions 30B and 30C may each include one or more conductive through vias (e.g., conductive through vias 30B1 and 30C1, respectively). In some arrangements, the conductive through vias of the passive regions 30B and 30C are configured to transmit the data signal P3.

In some arrangements, a resistance of the conductive through via of the active region (e.g., the active regions 20A-20D) is lower than a resistance of a conductive through via of the passive region (e.g., the passive regions 30A-30C). In some arrangements, the conductive through via of the active region has a size (e.g., a radius or a diameter along the direction DR2) different form that of the conductive through via of the passive region. In some arrangements, a size (e.g., a radius or a diameter along the direction DR2) of the conductive through via of the active region is larger than a size (e.g., a radius or a diameter along the direction DR2) of the conductive through via of the passive region. In some arrangements, the conductive through via of an active region has a size that is configured to provide a sufficient remaining space in the active region for disposing or accommodating active elements therein. In some arrangements, the conductive through via of the active region is configured to supply power signals to the electronic components 50A-50D, and the conductive through via of the passive region is configured to transmit data signals to the electronic components. Thus the conductive through via of the active region having a relatively low resistance and/or being relatively large improves the electrical performance of the electronic package 1. In some arrangements, the active region includes a plurality or a group of relatively small conductive through vias instead of one relatively large conductive through via. Therefore, the group of small conductive through vias can function the same as a relatively large conductive through via which improves power supply, and the manufacturing process of forming a group of small vias is relatively simple compared to formation of a large via (e.g., by drilling), such that yield can be improved.

The electronic components 50A and 50B are disposed on, adjacent to, or over the surface 102 of the semiconductor substrate 10, and the electronic components 50C and 50D are disposed on, adjacent to, or over the surface 102A of the semiconductor substrate 10A. In some arrangements, the electronic components 50A-50D may be or include processing units. In some arrangements, the electronic component 50A is electrically connected to the active region 20B of the semiconductor substrate 10. In some arrangements, the electronic component 50B is electrically connected to the active region 20A and the passive region 30A of the semiconductor substrate 10. In some arrangements, the electronic component 50C is electrically connected to the active regions 20C and 20D and the passive region 30B of the semiconductor substrate 10A. In some arrangements, the electronic component 50D is electrically connected to the active region 20D and the passive region 30C of the semiconductor substrate 10A. In some arrangements, the power signal P1 is transmitted to the electronic component (e.g., the electronic components 50A-50D) through the passive element structure of the active region. In some arrangements, the power signal P1 is regulated into the power signal P2 by the active region, and then the power signal P2 is transmitted to the electronic component (e.g., the electronic components 50A-50D). For example, the power signal P1 may be transmitted to the passive element structure of the active region 20B, the power signal P1 may be regulated into the power signal P2 by the active region 20B, and then the regulated power signal P2 may be transmitted to the electronic component 50A. In some arrangements, the electronic component (e.g., the electronic components 50A-50D) is located on a side (e.g., the surface 102) of the semiconductor substrate 10 and configured to transmit a signal (e.g., the data signal P3) to an opposite side (e.g., the surface 101) of the semiconductor substrate 10 through the passive region. In some arrangements, each of the electronic components 50A-50D may include one or more of a central processing unit (CPU), a microcontroller unit (MCU), a graphics processing unit (GPU), an ASIC, or a combination thereof. In some arrangements, each of the electronic components 50A-50D may include one or more processing chiplets. In some arrangements, each of the electronic components 50A-50D may include one or more of a CPU chiplet, a MCU chiplet, a GPU chiplet, an ASIC chiplet, an input/output (I/O) chiplet, or a combination thereof. The plurality of chiplets may be designed to provide full functionality of an independent semiconductor chip (e.g., an ASIC chip).

The external connection element 60 may electrically connect the semiconductor substrate 10 and the semiconductor substrate 10A. In some arrangements, the external connection element 60 is located outside of the semiconductor substrates 10 and 10A. In some arrangements, the external connection element 60 electrically connects one or more of the active regions of the semiconductor substrate 10 to one or more of the active regions of the semiconductor substrate 10A. In some arrangements, the external connection element 60 electrically connects an active element of the semiconductor substrate 10 to an active element of the semiconductor substrate 10A. In some arrangements, the external connection element 60 includes one or more of a bridging component, a conductive layer, a redistribution layer, conductive wiring, or so on. For example, the external connection element 60 illustrated in FIG. 1 is a bridge die including TSVs.

An RDL 74 may be disposed over the carrier 100. In some arrangements, the RDL 74 is between the semiconductor substrates 10 and 10A and the external connection element 60. In some arrangements, the RDL 74 is between the electronic components 80 and 80' and the external connection elements 60', and 60". In some arrangements, the semiconductor substrate 10 is electrically connected to the semiconductor substrate 10A through the external connection element 60 and portions of the RDL 74.

The external connection elements 60', and 60" may be disposed over the carrier 100. In some arrangements, the external connection elements 60', and 60" are located outside of the semiconductor substrates 10 and 10A. In some arrangements, each of the external connection elements 60', and 60" includes one or more of a bridging component, a conductive layer, a redistribution layer, conductive wiring, or so on. For example, the external connection elements 60', and 60" illustrated in FIG. 1 are bridge dies, each of which includes one or more TSVs.

The encapsulant 70 may entirely encapsulate the semiconductor substrates 10 and 10A and the electronic components 50A-50D. In some arrangements, the encapsulant 70 further encapsulates the terminals 410-440 entirely. In some arrangements, the encapsulant 70 covers at least a portion (e.g., a surface) of the RDL 74.

The encapsulant 72 may entirely encapsulate the external connection elements 60, 60', and 60" and the electronic components 82 and 82'. In some arrangements, the encapsulant 72 further encapsulates at least a portion of the RDL 74. In some arrangements, the encapsulant 72 further entirely encapsulates terminals 410' which electrically connect to the terminals 410. In some arrangements, the encapsulant 72 further encapsulates at least a portion of terminals 430' which electrically connect to the terminals 430. The terminals 430' may be or include conductive through vias (e.g., through mold vias (TMVs)). In some arrangements, the encapsulant 72 further encapsulates at least a portion of terminals 450 which electrically connect the external connection elements 60, 60', and 60" and the electronic components 82 and 82' to the conductive elements 100C on the carrier 100.

The electronic components 80 and 80' may be exposed by the encapsulant 70. In some arrangements, each of the electronic components 80 and 80' is spaced apart from the encapsulant 70 with a gap therebetween. In some arrangements, the electronic component 80 is electrically connected to the semiconductor substrate 10 using the external connection element 60'. The electronic component 80 may be electrically connected to the external connection element 60' using terminals 460 and 460' and a portion of the RDL 74.

In some arrangements, the electronic component 80' is electrically connected to the semiconductor substrate 10A using the external connection element 60". The electronic component 80' may be electrically connected to the external connection element 60" using terminals 460 and 460' and another portion of the RDL 74. In some arrangements, the electronic components 80 and 80' may be or include input/output (I/O) modules. For example, the electronic components 80 and 80' may be optical I/O modules that are exposed by the encapsulant 70 and configured to connect to an external optical component (not shown), such as optical fibers.

The electronic components 82, and 82' may be disposed over the carrier 100. In some arrangements, the electronic components 82 and 82' may be arranged next to or adjacent to the external connection element 60. As shown in FIG. 1, the external connection element 60 is between the electronic components 82 and 82'. Electrical signals may be transmitted between the electronic components 82, and 82' using the external connection element 60. In some arrangements, the electronic components 82, and 82' may include one or more of a power management component (e.g., a PMIC), a double data rate (DDR) controller, a deep trench capacitor (DTC), an inductor, or so on.

Traditionally, one or more active elements (e.g., power management components) may be disposed or stacked between an interposer (e.g., a passive interposer without active elements) and electronic components. A power signal transmitted from the interposer may be regulated by the active element, which is disposed over the interposer. Then, the regulated power signal may be transmitted to the electronic components over the active element. The power supply path including the TSVs in the passive interposer, the active element over the passive interposer, and the electronic component is relatively long. Thus, power loss is relatively high, and signal distortion may occur. In addition, another path for a power signal (e.g., ground) or a data signal may pass through the interposer (e.g., the passive interposer without active elements) and one or more TSVs next to the active element and over the interposer to connect to the electronic component. This path is also relatively long and may increase power loss and/or signal distortion. Moreover, as the number of electronic components or chiplets in a package increases, the size or area of the reticle for forming the substrate or interposer for the electronic components or chiplets increases accordingly, which may cause a decrease in yield.

In contrast, according to some arrangements of the present disclosure, the one or more active regions are integrated or embedded into a semiconductor substrate (e.g., a silicon-based substrate) to form a semiconductor substrate, and the power supply path does not pass through any additional interposer under the active region of the semiconductor substrate. Therefore, the power supply path can be shortened, and electrical performance of the electronic package can be improved. For example, given that the active regions 20A and 20B are integrated within the semiconductor substrate 10, the power signal P1 can be transmitted into the active region 20A or 20B of the semiconductor substrate 10 directly without passing through any additional layer of TSVs below the active region 20A or 20B, and thus the power supply path for the power signal P1 is relatively short. Therefore, power loss can be reduced and signal distortion mitigated or prevented.

In addition, according to some arrangements of the present disclosure, the active and passive regions are integrated to form an active interposer. For example, the active region can regulate a power signal and transmit the regulated power signal, while the passive region can transmit a data signal different from the regulated power signal. Therefore, the active interposer can perform various functions on different power signals or data signals. For example, given that the active regions 20A and 20B are integrated with the passive region 30A forming an active interposer, while the power signal P1 can be transmitted into the active region 20A or 20B of the active interposer and regulated into the power signal P2, the data signal P3 which is different from the power signal P2 can be transmitted through the passive region 30A of the active interposer. In addition, the power signal P1 can be transmitted into the active region 20A or 20B directly without passing through any additional layer of TSVs below the active region 20A or 20B, and the data signal P3 can be transmitted through the passive region 30A instead of passing through two or more layers of TSVs. Therefore, the paths for different signals, such as the power signal P1 and the data signal P3, are both shortened. Accordingly, power loss can be reduced, signal distortion mitigated or prevented, and electrical performance of the electronic package 1 improved.

Moreover, according to some arrangements of the present disclosure, with the design of using external connection elements to electrically connect multiple separate semiconductor substrates, the size or area of the reticle for forming each of the semiconductor substrates can be reduced, and thus yield can be improved.

Figure 2:
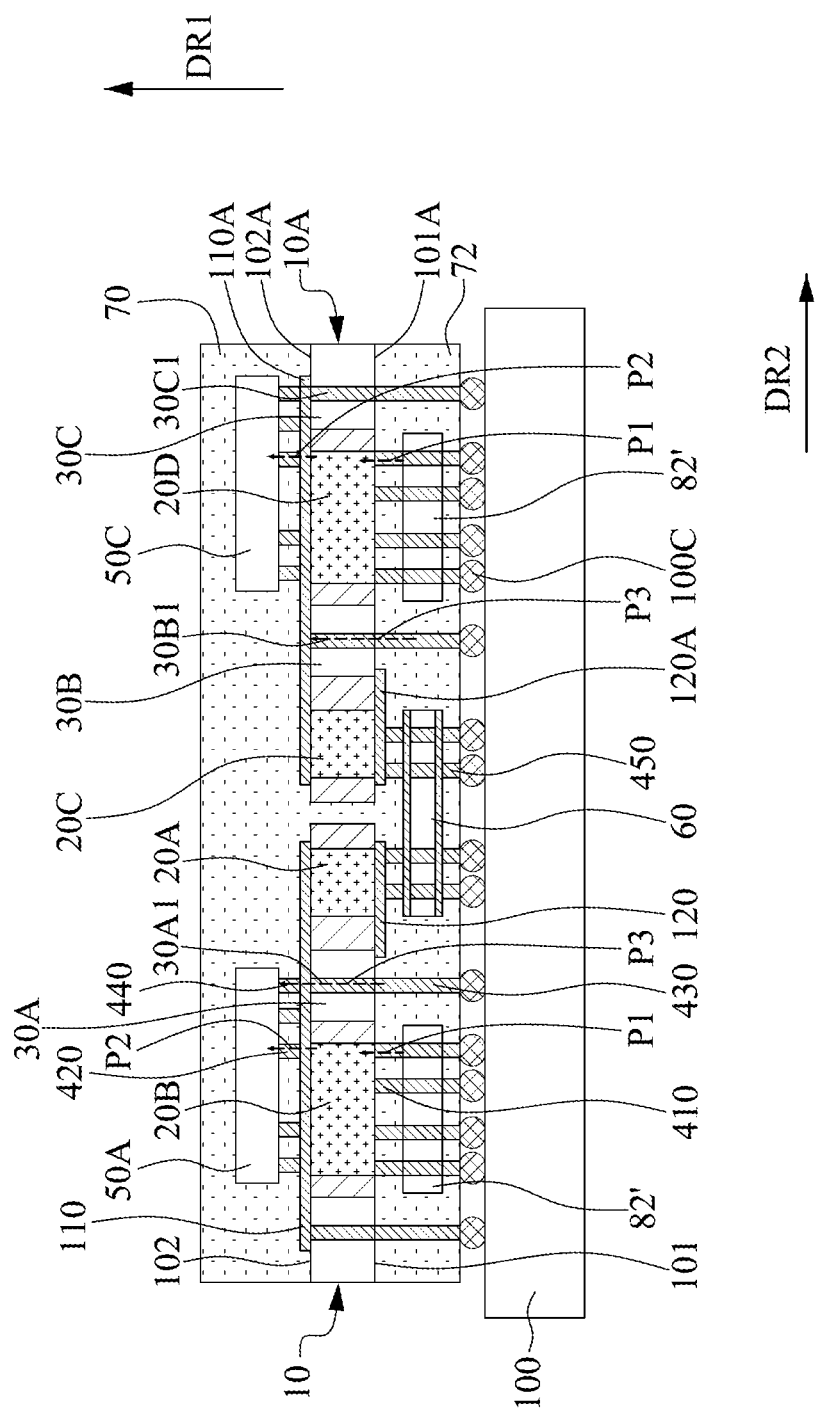
FIG. 2 is a cross-section of an electronic package in accordance with some arrangements of the present disclosure.

FIG. 2 is a cross-section of an electronic package 2 in accordance with some arrangements of the present disclosure. The electronic package 2 is similar to the electronic package 1 in FIG. 1, differing therefrom as follows. Description of the same components are omitted herein.

In some arrangements, the active region 20A of the semiconductor substrate 10 is electrically connected to the active region 20C of the semiconductor substrate 10A using the external connection element 60. The semiconductor substrate 10 may be electrically connected to the external connection element 60 using the conductive layer 120, and the semiconductor substrate 10A may be electrically connected to the external connection element 60 using the conductive layer 120A.

In some arrangements, the encapsulant 70 encapsulates at least a portion of the surface 102 of the semiconductor substrate 10 and at least a portion of the surface 102A of the semiconductor substrate 10A. A portion of the encapsulant 70 may be between the semiconductor substrate 10 and the semiconductor substrate 10A. In some arrangements, the encapsulant 72 encapsulates at least a portion of the surface 101 of the semiconductor substrate 10 and at least a portion of the surface 101A of the semiconductor substrate 10A. The encapsulant 72 may encapsulate and at least a portion of each of the conductive layers 120 and 120A.

Figure 2A:
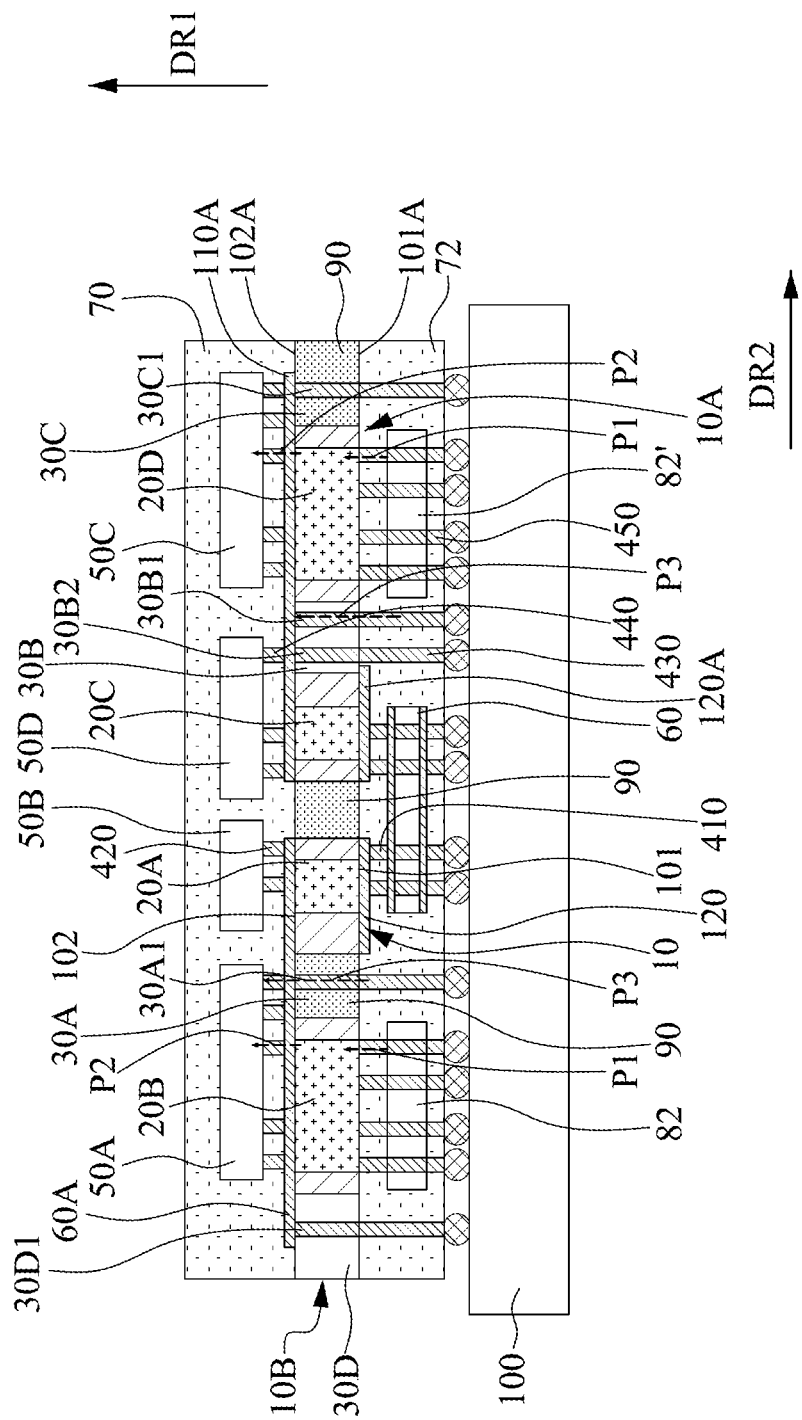
FIG. 2A is a cross-section of an electronic package in accordance with some arrangements of the present disclosure.

FIG. 2A is a cross-section of an electronic package 2A in accordance with some arrangements of the present disclosure. The electronic package 2A is similar to the electronic packages 1 in FIGS. 1 and 2 in FIG. 2, differing therefrom as follows. Description of the same components are omitted herein.

In some arrangements, the electronic package 2A further includes a semiconductor substrate 10B adjacent to the semiconductor substrate 10. The semiconductor substrate 10B may be spaced apart from the semiconductor substrate 10 by at least separating structures 90. In some embodiments, the semiconductor substrate 10B may be spaced apart from the semiconductor substrate 10 by at least the separating structure 90, the silicon-based material of the semiconductor substrate 10, and the silicon-based material of the semiconductor substrate 10B.

In some arrangements, the electronic package 2A further includes one or more separating structures 90. The separating structure 90 may be between the semiconductor substrate 10 and the semiconductor substrate 10B. The separating structure 90 may be between the semiconductor substrate 10 and the semiconductor substrate 10A. In some arrangements, the separating structure 90 includes at least one conductive through via (e.g., conductive through vias 30A1 and 30C1). In some arrangements, the separating structure 90 is made of or includes an insulating material, such as a molding compound. The conductive through via of the separating structure 90 may be referred to as a TMV. In some arrangements, the conductive through via of the separating structure 90 may be configured to transmit one or more data signals (e.g., the data signal P3). In some arrangements, the semiconductor substrate may not include enough space for forming a passive region therein because forming a passive region in the semiconductor substrate may occupy the space predetermined saved for the active region(s). In some arrangements, the conductive through vias in the separating structure 90 instead of the passive region can transmit one or more data signals. Thus the function of the passive region of the semiconductor substrate can be replaced by the conductive through vias of the separating structure 90, and the space utilization and the design flexibility can be improve.

In some arrangements, the semiconductor substrate 10 may be free of a passive region. For example, a passive region 30A may be separated from the semiconductor substrate 10. The separating structure 90 may be disposed in the passive region (e.g., the passive regions 30A and 30C). In some arrangements, the semiconductor substrate 10A includes active regions 20C and 20D and a passive region 30B embedded in the material (e.g., a silicon-based material) of the semiconductor substrate 10A. In some arrangements, the passive region 30B includes a plurality of conductive through vias 30B1 and 30B2 spaced apart. The conductive through vias 30B1 and 30B2 are configured to transmit different signals. For example, the conductive through via 30B1 and 30B2 may be configured to transmit an input signal and an output signal, respectively. The input signal may be transmitted to one of the electronic components, and the output signal may be transmitted from one electronic component to another component or device. In some arrangements, the semiconductor substrate 10B includes an active region 20B and a passive region 30D. The passive region 30D includes a conductive through via 30D1 embedded in the material (e.g., a silicon-based material) of the semiconductor substrate 10B.

In some arrangements, the electronic component 50A is electrically connected to the active region 20B and the passive region 30A. In some arrangements, the electronic component 50B is electrically connected to the active regions 20A. In some arrangements, the electronic component 50D is electrically connected to the active region 20C and the passive region 30B. In some arrangements, the electronic component 50C is electrically connected to the active region 20D and the passive region 30C.

In some arrangements, the external connection element 60 electrically connects the active region 20A and the active region 20C. In some arrangements, the external connection element 60 includes a bridging component. In some arrangements, the electronic package 3 further includes an external connection element 60A disposed on the surface 102 of the semiconductor substrate 10. In some arrangements, the external connection element 60A electrically connects the active region 20A and the active region 20B. The external connection element 60A may include a conductive layer or an RDL. In some arrangements, the external connection element 60A is located outside of the semiconductor substrates 10 and 10B and electrically connects the semiconductor substrates 10 and 10B.

Figure 3:
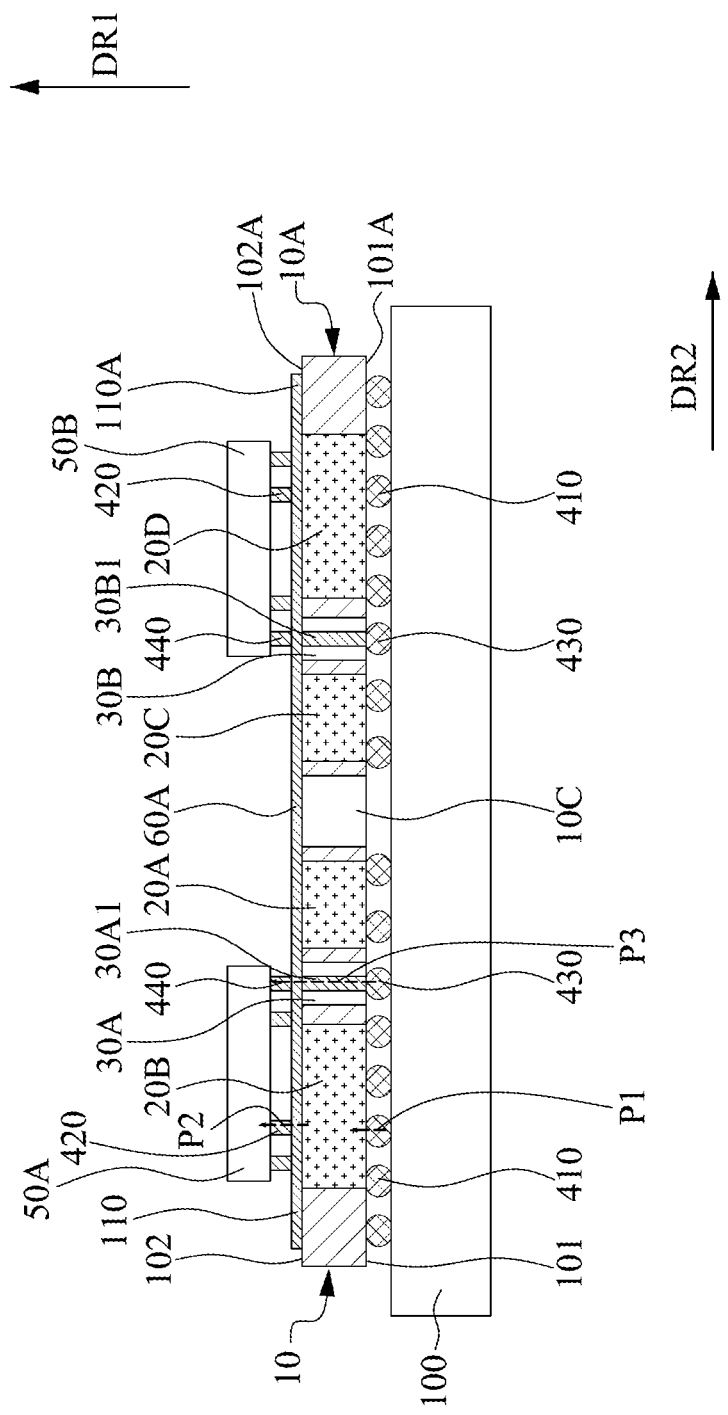
FIG. 3 is a cross-section of an electronic package in accordance with some arrangements of the present disclosure.

FIG. 3 is a cross-section of an electronic package 3 in accordance with some arrangements of the present disclosure. The electronic package 3 is similar to the electronic packages 1 in FIGS. 1 and 2 in FIG. 2, differing therefrom as follows. Description of the same components are omitted herein.

In some arrangements, the semiconductor substrate 10 and the semiconductor substrate 10A are separated semiconductor substrates that are spaced apart from each other by an element 10C. The element 10C may be formed of or include a material that is the same as or different from the materials of the semiconductor substrates 10 and 10A. The element 10C may be formed or of or include silicon-based material of the semiconductor substrate 10 or the semiconductor substrate 10A. The element 10C may be formed or of or include a dielectric material. In some arrangements, the semiconductor substrate 10 includes the conductive layer 110. The semiconductor substrate 10A includes the conductive layer 110A. In some other arrangements, the semiconductor substrates 10 and 10A (also referred to as active connection elements) and the element 10C share a substrate body (e.g., a silicon-based layer). The semiconductor substrates 10 and 10A and the element 10C may be formed from one substrate body (e.g., a silicon-based layer). The boundary of the semiconductor substrate 10 (or the active connection element) may be defined by the range covered by the conductive layer 110, and the boundary of the semiconductor substrate 10A (or the active connection element) may be defined by the range covered by the conductive layer 110A. The conductive layers 110 and 110A may be referred to as BEOLs.

In some arrangements, the external connection element 60A is disposed between the electronic component 50A and the electronic component 50B and is disposed on the surface 102 of the semiconductor substrate 10. The external connection element 60A may be further disposed on the surface 102A of the semiconductor substrate 10A. In some arrangements, the external connection element 60A connects the conductive layer 110 and the conductive layer 110A. The external connection element 60A may include a conductive layer or an RDL. In some arrangements, the external connection element 60A includes an RDL disposed between the electronic components 50A and the surface 102A of the semiconductor substrate 10A. In some arrangements, the external connection element 60A includes an RDL disposed between the electronic components 50B and the surface 102A of the semiconductor substrate 10A. In some arrangements, the external connection element 60A may be configured to transmit a signal between the electronic components 50A and 50B. The signal may be or include high speed data transmitted between the electronic components 50A and 50B. In some arrangements, the external connection element 60A may be configured to transmit the signal along or parallel to the direction DR2. The external connection element 60A may be referred to as a BEOL. In some arrangements, the external connection element 60A, the conductive layer 110, and the conductive layer 110A are formed integrally. In some arrangements, the external connection element 60A, the conductive layer 110, and the conductive layer 110A are formed integrally by the same operation in the BEOL process. The integral structure formed from the external connection element 60A, the conductive layer 110, and the conductive layer 110A may be referred to as a BEOL stitching structure.

Figure 3A:
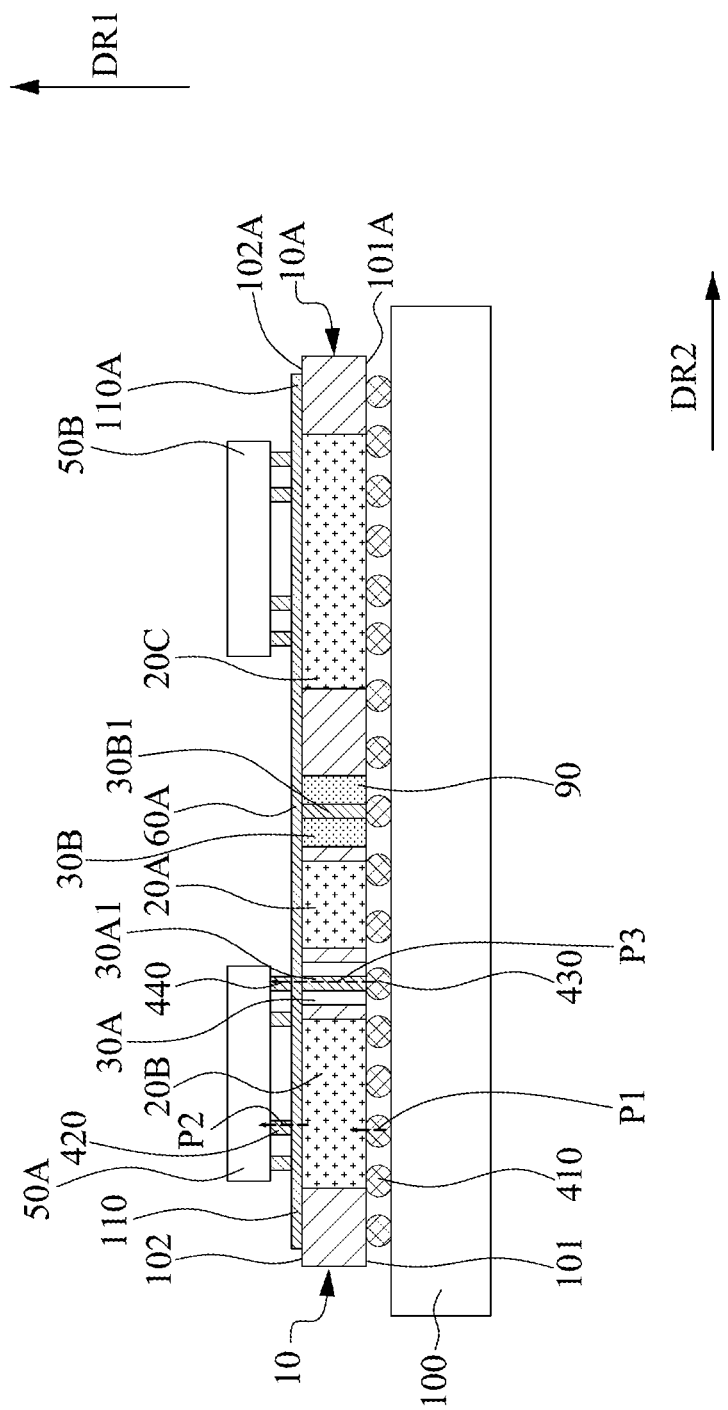
FIG. 3A is a cross-section of an electronic package in accordance with some arrangements of the present disclosure.

FIG. 3A is a cross-section of an electronic package 3A in accordance with some arrangements of the present disclosure. The electronic package 3A is similar to the electronic packages 1 in FIGS. 1 and 3 in FIG. 3, differing therefrom as follows. Description of the same components are omitted herein.

In some arrangements, the electronic package 3A includes an separating structure 90 between the semiconductor substrate 10 and the semiconductor substrate 10A. In some arrangements, the separating structure 90 includes at least one conductive through via 30B1. In some arrangements, the separating structure 90 includes an insulating material, such as at least one of a molding compound, an underfill, or so on. The conductive through via of the separating structure 90 may be referred to as a TMV.

In some arrangements, the semiconductor substrate 10A is free of a passive region. For example, the passive region 30B may be separated from the semiconductor substrates 10 and 10A. The separating structure 90 may be disposed in the passive region 30B. In some arrangements, the semiconductor substrate 10 includes active regions 20A and 20B and a passive region 30A.

Figure 3B:
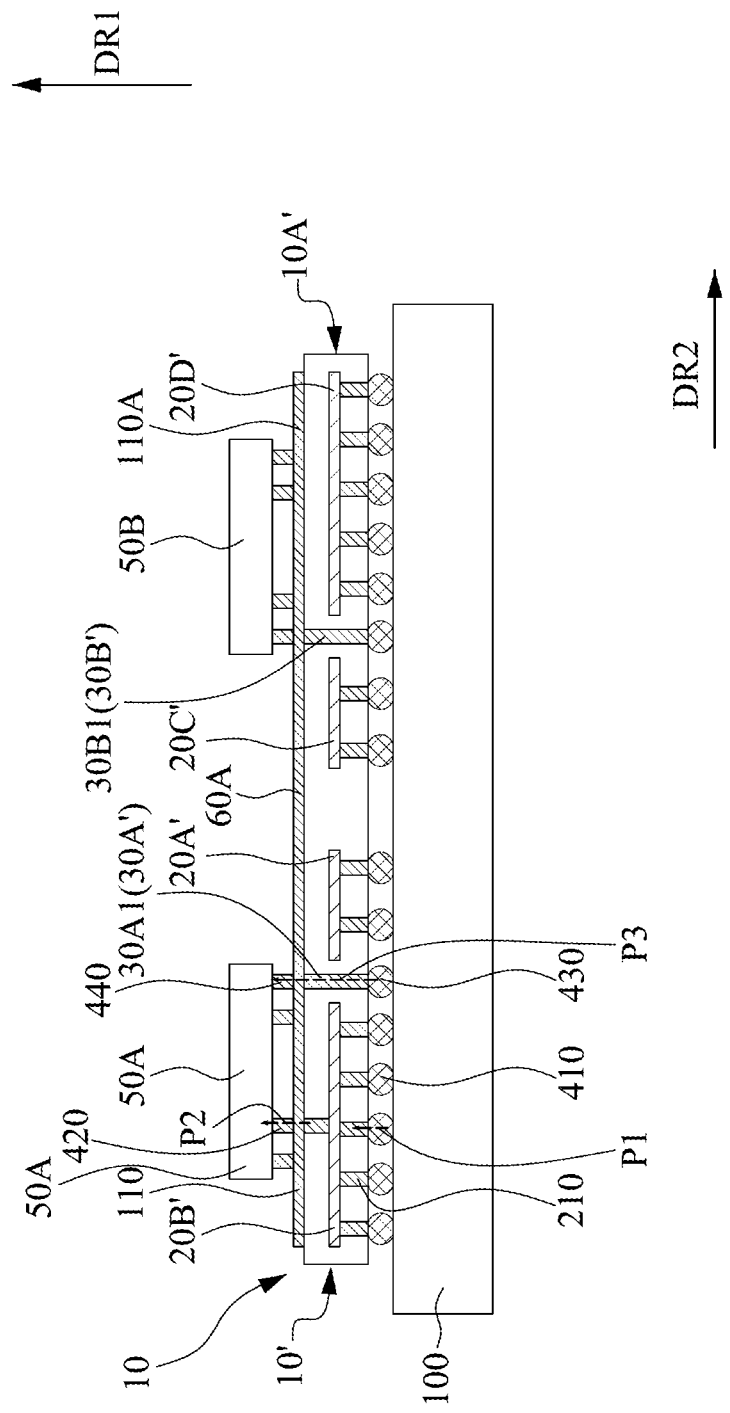
FIG. 3B is a cross-section of an electronic package in accordance with some arrangements of the present disclosure.

FIG. 3B is a cross-section of an electronic package in accordance with some arrangements of the present disclosure. The electronic package 3B is similar to the electronic package 1 in FIG. 1 and the electronic package 3 in FIG. 3, differing therefrom as follows. Description of the same components are omitted herein.

In some arrangements, the semiconductor substrate 10 includes active regions 20A'-20D' and passive regions 30A' and 30B'. In some arrangements, the semiconductor substrate 10 includes active connection elements 10' and 10A'. The active connection element 10' may include the active regions 20A' and 20B' and the passive region 30A'. The active connection element 10A' may include the active regions 20C' and 20D' and the passive region 30B'. In some arrangements, each of the active regions 20A'-20D' includes a layer of active element(s). The layers of active element(s) of the active regions 20A'-20D' may be electrically connected to corresponding terminals (e.g., terminals 410 or 430) through connection elements within the active regions 20A'-20D'. For example, the active region 20B' includes connection elements 210 electrically connecting the layer of active element(s) to the terminals 410. In some arrangements, the passive region 30A' includes at least one conductive through via 30A1 located between the active regions 20A' and 20B'. In some arrangements, the passive region 30B' includes at least one conductive through via 30B1 located between the active regions 20C' and 20D'.

Figure 4:
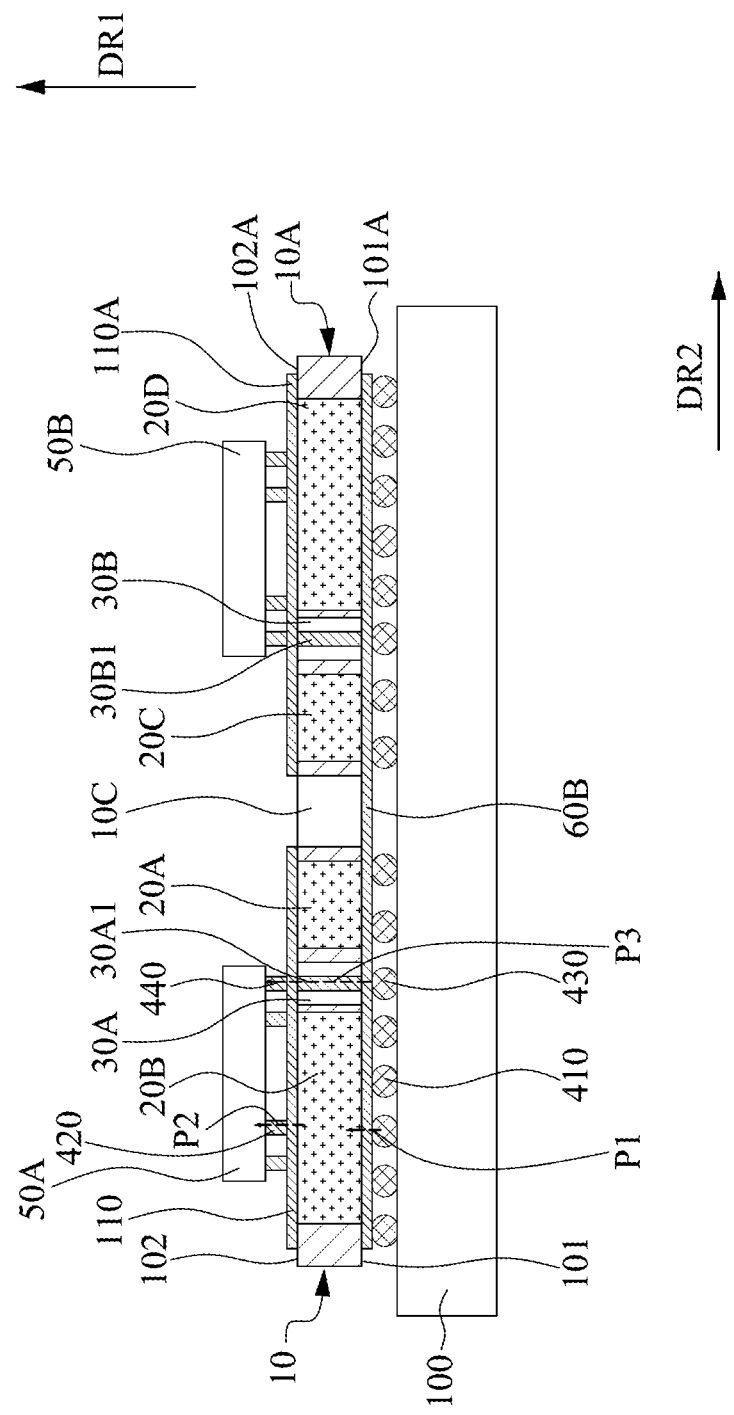
FIG. 4 is a cross-section of an electronic package in accordance with some arrangements of the present disclosure.

FIG. 4 is a cross-section of an electronic package 4 in accordance with some arrangements of the present disclosure. The electronic package 4 is similar to the electronic packages 1 in FIGS. 1 and 3 in FIG. 3, differing therefrom as follows. Description of the same components are omitted herein.

In some arrangements, the electronic package 4 includes an external connection element 60B on or adjacent to the surface 101 of the semiconductor substrate 10. The external connection element 60B may be further disposed on or adjacent to the surface 101A of the semiconductor substrate 10A. In some arrangements, the external connection element 60B electrically connects the active region of the semiconductor substrate 10 and the active region of the semiconductor substrate 10A. In some arrangements, the external connection element 60B includes an RDL. In some arrangements, the external connection element 60B includes an RDL disposed on the surface 101 of the semiconductor substrate 10. In some arrangements, the external connection element 60B may be adhered to the surface 101 of the semiconductor substrate 10 and the surface 101A of the semiconductor substrate 10A through an adhesive layer (not shown). The through holes of the adhesive layer can be formed by lase or mechanical drilling and can be filled with conductive materials (e.g., by plating) to provide the electrical connection between the external connection element 60B and the semiconductor substrates 10 and 10A. In some arrangements, the electrical connection between the external connection element 60B and the semiconductor substrates 10 and 10A may be attained by way of flip-chip technique.

In some arrangements, the semiconductor substrate 10 and the semiconductor substrate 10A are separated semiconductor substrates that are spaced apart from each other by an element 10C. The element 10C may be formed of or include a material that is the same as or different from the materials of the semiconductor substrates 10 and 10A. The element 10C may be formed or of or include silicon-based material of the semiconductor substrate 10 or the semiconductor substrate 10A. The element 10C may be formed or of or include a dielectric material. In some arrangements, the semiconductor substrate 10 includes the conductive layer 110, and the semiconductor substrate 10A includes the conductive layer 110A which is separate and spaced apart from the conductive layer 110. In some other arrangements, the semiconductor substrates 10 and 10A (also referred to as active connection elements) and the element 10C share a substrate body (e.g., a silicon-based layer). The semiconductor substrates 10 and 10A and the portion 10C may be formed from one substrate body (e.g., a silicon-based layer). The boundary of the semiconductor substrate 10 (or the active connection element) may be defined by the range covered by the conductive layer 110, and the boundary of the semiconductor substrate 10A (or the active connection element) may be defined by the range covered by the conductive layer 110A.

Figure 4A:
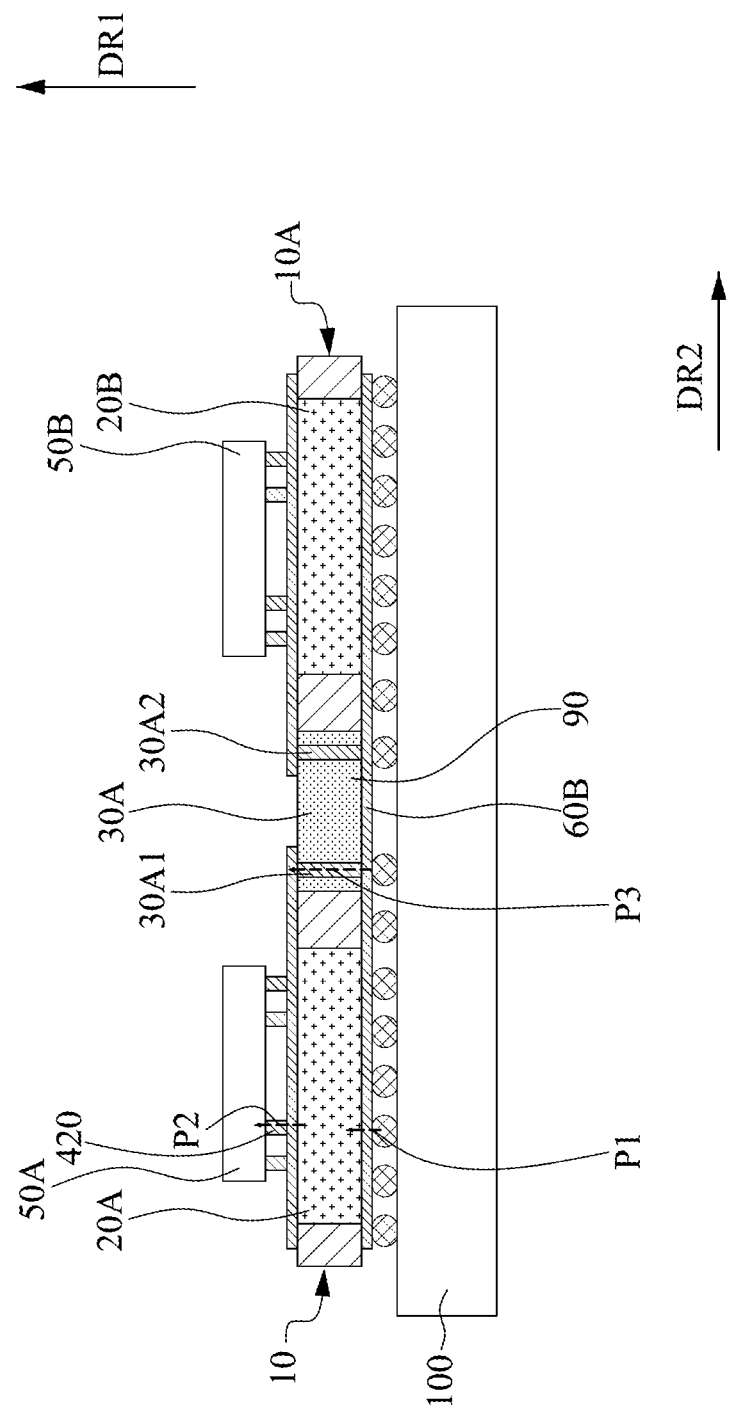
FIG. 4A is a cross-section of an electronic package in accordance with some arrangements of the present disclosure.

FIG. 4A is a cross-section of an electronic package 4A in accordance with some arrangements of the present disclosure. The electronic package 4A is similar to the electronic packages 1 in FIGS. 1 and 4 in FIG. 4, differing therefrom as follows. Description of the same components are omitted herein.

In some arrangements, the semiconductor substrates 10 and 10A are free of a passive region. In some arrangements, a passive region 30A that is disposed outside of the semiconductor substrates 10 and 10A includes conductive through vias 30A1 and 30A2 located between the semiconductor substrate 10 and the semiconductor substrate 10A. In some arrangements, the separating structure 90 may be disposed in the passive region 30A. In some arrangements, the external connection element 60B electrically connects the semiconductor substrate 10 and the semiconductor substrate 10A. In some arrangements, the external connection element 60B electrically connects the active region 20A of the semiconductor substrate 10 and the active region 20B of the semiconductor substrate 10A. In some arrangements, the semiconductor substrates 10 and 10A may not include enough space for forming one or more passive regions therein because forming a passive region in the semiconductor substrate may occupy the space reserved for the active region(s). In some arrangements, the conductive through vias in the separating structure 90 can transmit one or more data signals. Thus, the function of the passive region(s) of the semiconductor substrate 10 or 10A can be replaced by the conductive through vias of the separating structure 90, the space utilization and the design flexibility can be improved.

Figure 5:
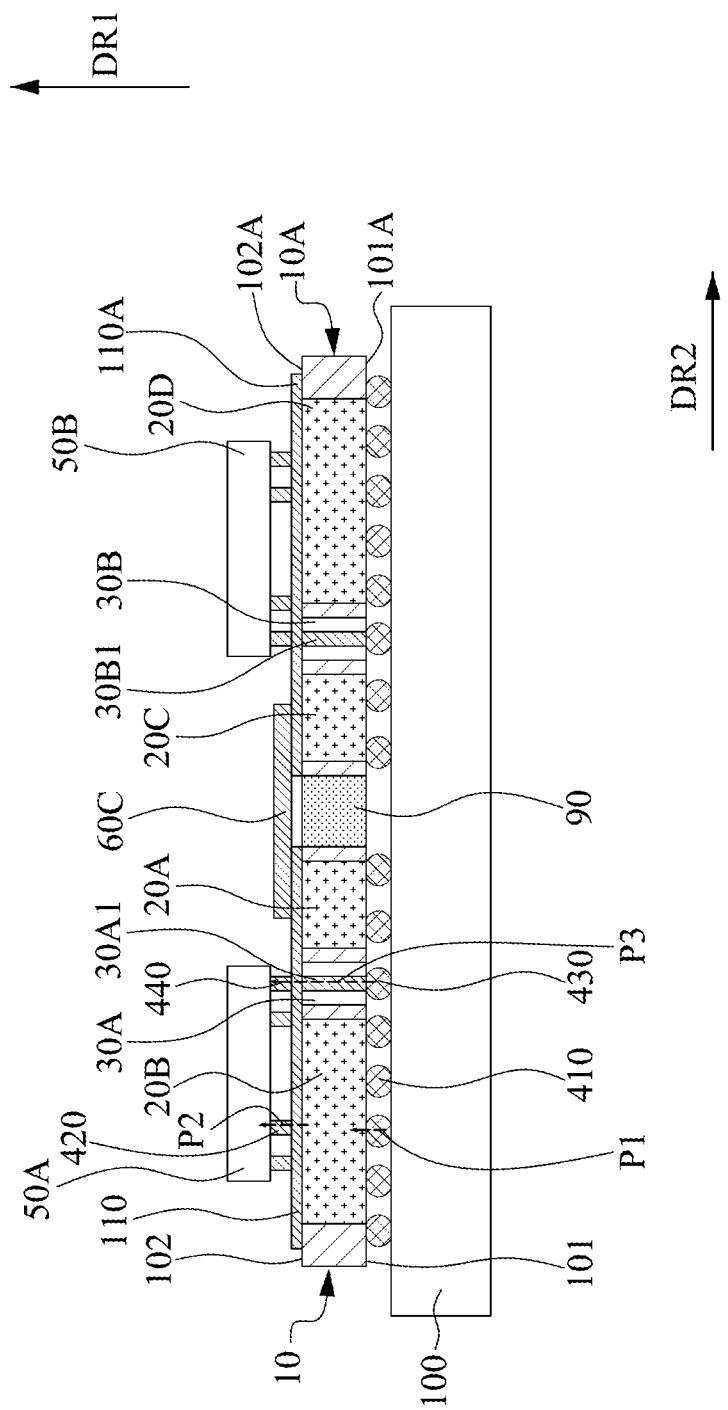
FIG. 5 is a cross-section of an electronic package in accordance with some arrangements of the present disclosure.

FIG. 5 is a cross-section of an electronic package 5 in accordance with some arrangements of the present disclosure. The electronic package 5 is similar to the electronic packages 1 in FIGS. 1 and 3 in FIG. 3, differing therefrom as follows. Description of the same components are omitted herein.

In some arrangements, the electronic package 5 includes an external connection element 60C on or adjacent to the surface 102 of the semiconductor substrate 10. The external connection element 60C may be further disposed on or adjacent to the surface 102A of the semiconductor substrate 10A. In some arrangements, the external connection element 60C electrically connects the semiconductor substrate 10 and the semiconductor substrate 10A. In some arrangements, the external connection element 60C electrically connects the active region 20A of the semiconductor substrate 10 and the active region 20C of the semiconductor substrate 10A. In some arrangements, the external connection element 60C includes an RDL. In some arrangements, the separating structure 90 is disposed between the semiconductor substrate 10 and the semiconductor substrate 10A. In other arrangements, the separating structure 90 may include a molding compound covering or encapsulating the semiconductor substrates 10 and 10A, the electronic components 50A and 50B, and the external connection element 60C.

Figure 6:
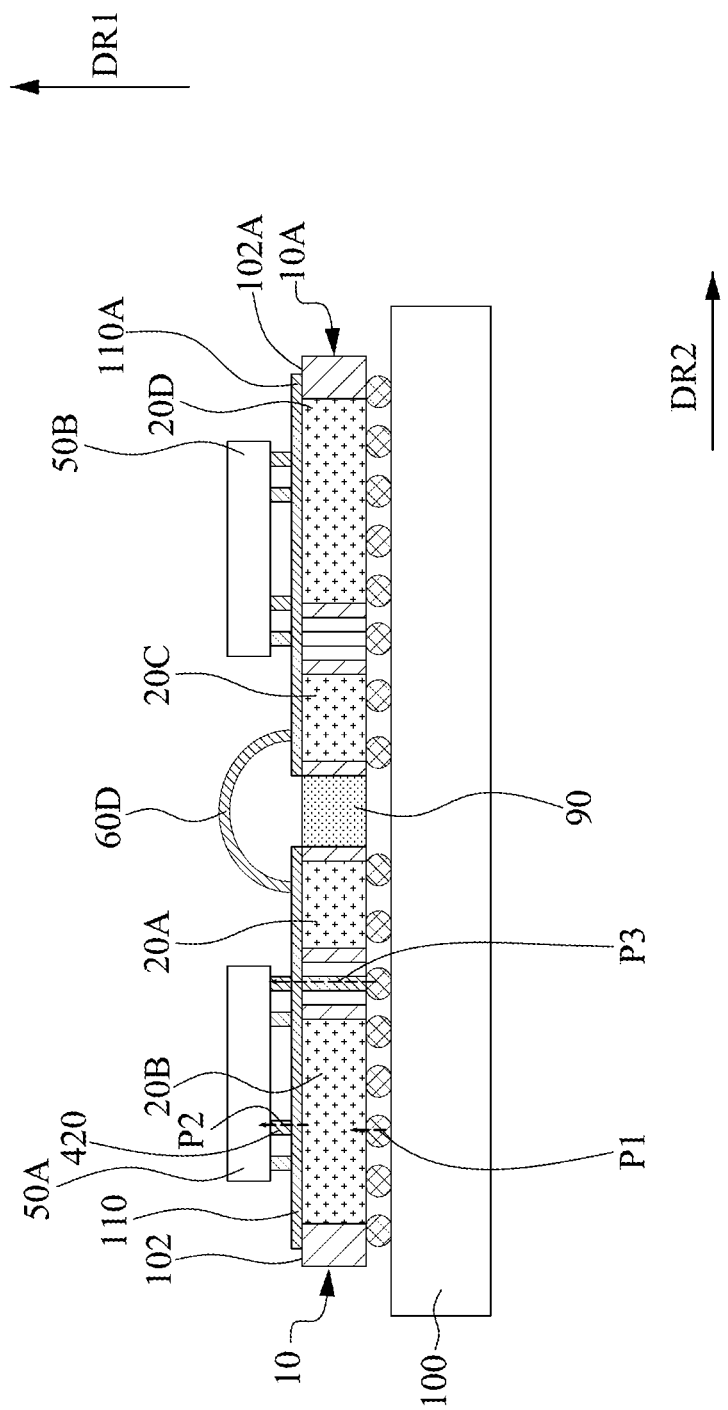
FIG. 6 is a cross-section of an electronic package in accordance with some arrangements of the present disclosure.

FIG. 6 is a cross-section of an electronic package 6 in accordance with some arrangements of the present disclosure. The electronic package 6 is similar to the electronic packages 1 in FIGS. 1 and 3 in FIG. 3, differing therefrom as follows. Description of the same components are omitted herein.

In some arrangements, the electronic package 6 includes an external connection element 60D over the surface 102 of the semiconductor substrate 10. In some arrangements, the external connection element 60D electrically connects the semiconductor substrate 10 and the semiconductor substrate 10A. In some arrangements, the external connection element 60D electrically connects the active region 20A of the semiconductor substrate 10 and the active region 20C of the semiconductor substrate 10A. In some arrangements, the external connection element 60C includes conductive or bonding wiring. The bonding wire may be electrically connected to the conductive layers 110 and 110A. In some arrangements, the separating structure 90 is disposed between the semiconductor substrate 10 and the semiconductor substrate 10A. In other arrangements, the separating structure 90 may include a molding compound covering or encapsulating the semiconductor substrates 10 and 10A, the electronic components 50A and 50B, and the external connection element 60D.

Figure 7:
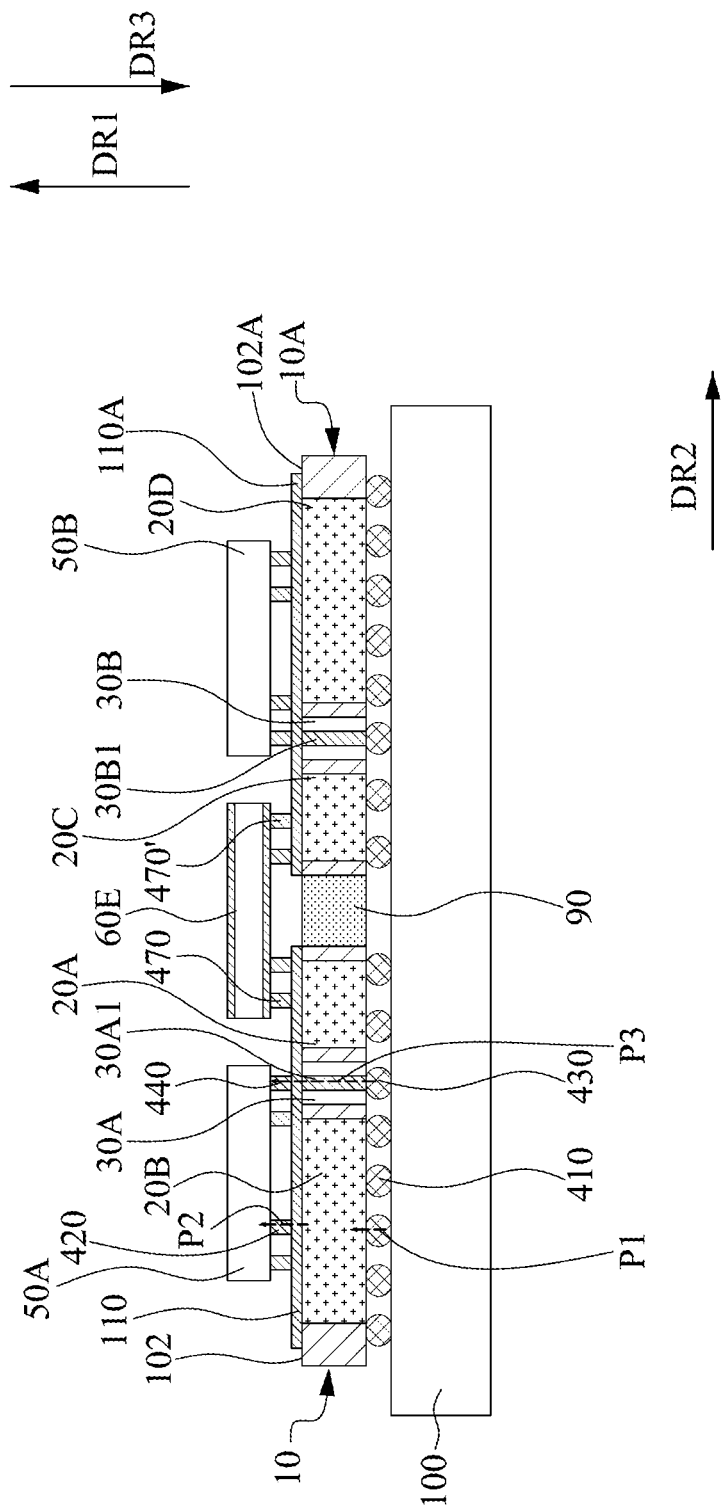
FIG. 7 is a cross-section of an electronic package in accordance with some arrangements of the present disclosure.

FIG. 7 is a cross-section of an electronic package 7 in accordance with some arrangements of the present disclosure. The electronic package 7 is similar to the electronic packages 1 in FIGS. 1 and 3 in FIG. 3, differing therefrom as follows. Description of the same components are omitted herein.

In some arrangements, the electronic package 7 includes an external connection element 60E over the surface 102 of the semiconductor substrate 10. The external connection element 60E may be further disposed over the surface 102A of the semiconductor substrate 10A. In some arrangements, the external connection element 60E electrically connects the semiconductor substrate 10 and the semiconductor substrate 10A. In some arrangements, the external connection element 60E electrically connects the active region 20A of the semiconductor substrate 10 and the active region 20C of the semiconductor substrate 10A. In some arrangements, the external connection element 60E electrically connects the active element of the semiconductor substrate 10 and the active element of the semiconductor substrate 10A. In some arrangements, the external connection element 60E may be configured to transmit a signal between the electronic components 50A and 50B. The signal may be or include high speed data transmitted between the electronic components 50A and 50B. In some arrangements, the external connection element 60E may be configured to transmit the signal along or parallel to the direction DR2. In some arrangements, the external connection element 60E may be further configured to transmit the signal in the direction DR1 (or DR3). In some arrangements, the external connection element 60C includes a bridging component. The bridging component may be electrically connected to the conductive layer 110 through connection elements 470 and to the conductive layer 110A through connection elements 470'. In some arrangements, the separating structure 90 is disposed between the semiconductor substrate 10 and the semiconductor substrate 10A. In other arrangements, the separating structure 90 may include a molding compound covering or encapsulating the semiconductor substrates 10 and 10A, the electronic components 50A and 50B, and the external connection element 60E.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component. In the description of some arrangements, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package comprising:
a semiconductor substrate comprising a first active region and a first passive region separated from the first active region, wherein the first active region is configured to regulate a power signal, and the first passive region is configured to transmit a data signal,
wherein the first active region comprises a conductive through via having a resistance lower than a resistance of a conductive through via of the first passive region,
wherein the first active region comprises a plurality of the conductive through vias, and
wherein a size of the conductive through via of the first active region is different from a size of the conductive through via of the first passive region.

2. The electronic package of claim 1, wherein the first active region comprises a passive element structure, and the passive element structure of the first active region transmits the power signal to a processing unit.

3. The electronic package of claim 1, wherein the power signal and the data signal are transmitted to a first electronic component.

4. The electronic package of claim 3, wherein the power signal is transmitted in a first direction, and the semiconductor substrate further includes an element configured to transmit a signal in a second direction different from the first direction.

5. The electronic package of claim 4, wherein the element is further configured to transmit the signal in a third direction substantially parallel to the first direction.

6. The electronic package of claim 1, further comprising a second active region, wherein the first passive region is between the first active region and the second active region.

7. The electronic package of claim 6, further comprising an external connection element electrically connecting the first active region and the second active region.

* * * * *